US012687564B2

(12) United States Patent
Gossmann

(10) Patent No.: US 12,687,564 B2
(45) Date of Patent: Jul. 21, 2026

(54) CAPACITANCE MEASUREMENT CIRCUITRY FOR A RESONANT TANK

(71) Applicant: Apple Inc., Cupertino, CA (US)

(72) Inventor: Timo W Gossmann, Munich (DE)

(73) Assignee: Apple Inc., Cupertino, CA (US)

( * ) Notice: Subject to any disclaimer, the term of this patent is extended or adjusted under 35 U.S.C. 154(b) by 308 days.

(21) Appl. No.: 18/360,380

(22) Filed: Jul. 27, 2023

(65) Prior Publication Data

US 2025/0035688 A1      Jan. 30, 2025

(51) Int. Cl.
*G01R 27/26* (2006.01)
*G01D 5/24* (2006.01)
*H04B 1/16* (2006.01)

(52) U.S. Cl.
CPC ........... *G01R 27/2605* (2013.01); *G01D 5/24* (2013.01); *H04B 1/16* (2013.01)

(58) Field of Classification Search
CPC ......... G01R 27/2605; H04B 1/16; G01D 5/24
See application file for complete search history.

(56) References Cited

U.S. PATENT DOCUMENTS

| | | | | |
|---|---|---|---|---|
| 3,350,701 A | * | 10/1967 | Bell | ........................ G08B 21/00 |
| | | | | 324/683 |
| 8,058,937 B2 | | 11/2011 | Qin et al. | |
| 8,067,948 B2 | | 11/2011 | Sequine | |
| 10,804,946 B2 | | 10/2020 | Wang et al. | |
| 11,159,191 B1 | * | 10/2021 | Mohammadnezhad | ..................... |
| | | | | H03G 3/3052 |

* cited by examiner

*Primary Examiner* — Amy He
(74) *Attorney, Agent, or Firm* — Treyz Law Group; Jason Tsai

(57) ABSTRACT

Wireless circuitry is provided that includes a transformer having a primary coil and a secondary coil, a first group of switchable capacitors coupled to a first terminal of the primary coil, a second group of switchable capacitors coupled to a second terminal of the primary coil, and capacitance measurement circuitry selectively coupled to a center tap of the primary coil during a measurement mode. The capacitance measurement circuitry can include a current source, a current sink, a comparator, a voltage generator for providing one or more threshold/reference voltages to the comparator, a frequency measurement circuit, and a capacitance calculation circuit configured to compute a capacitance of the first and second groups of switchable capacitors.

20 Claims, 10 Drawing Sheets

24

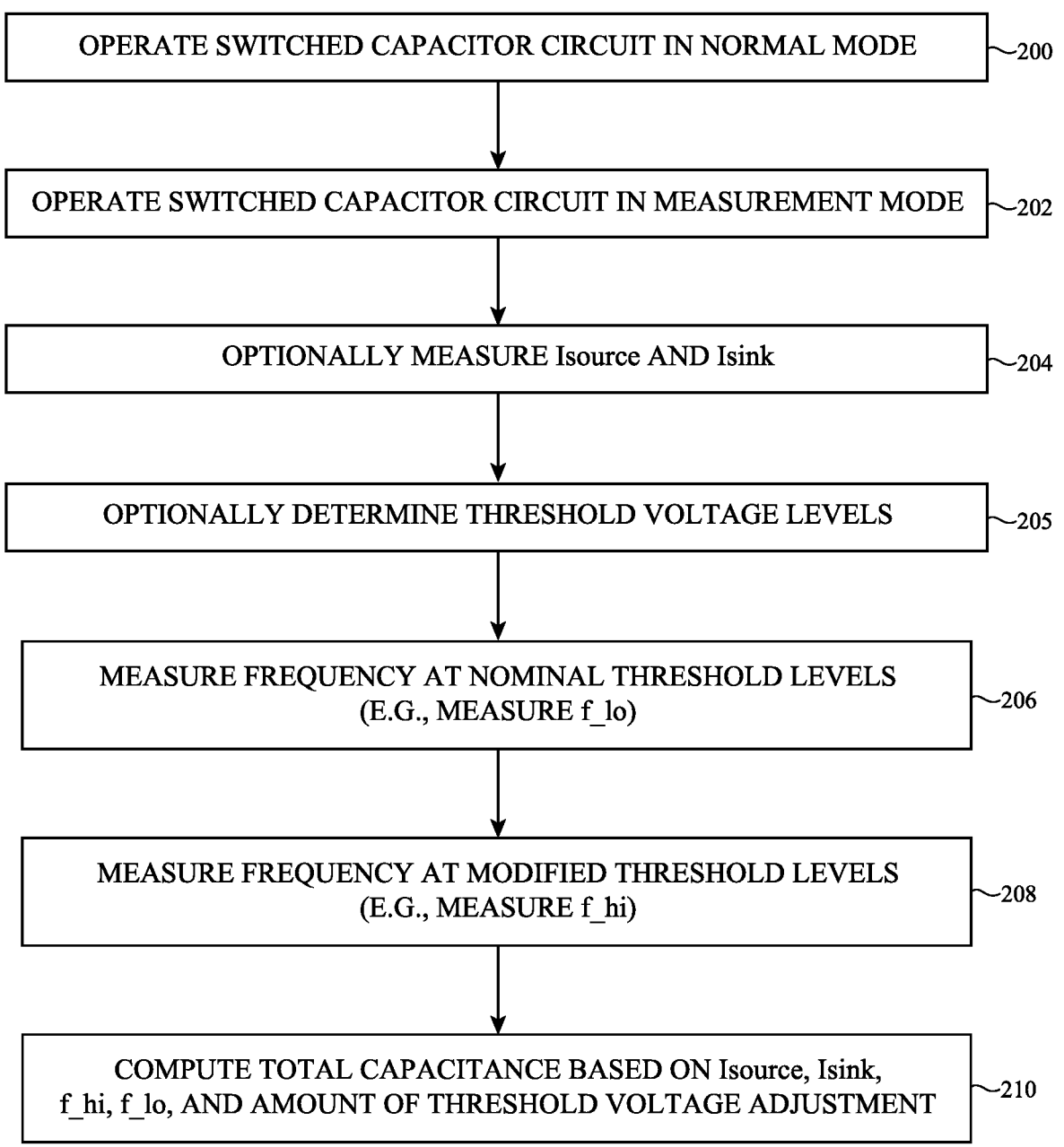

OPERATE SWITCHED CAPACITOR CIRCUIT IN NORMAL MODE ~200

OPERATE SWITCHED CAPACITOR CIRCUIT IN MEASUREMENT MODE ~202

OPTIONALLY MEASURE Isource AND Isink ~204

OPTIONALLY DETERMINE THRESHOLD VOLTAGE LEVELS ~205

MEASURE FREQUENCY AT NOMINAL THRESHOLD LEVELS
(E.G., MEASURE f_lo) ~206

MEASURE FREQUENCY AT MODIFIED THRESHOLD LEVELS
(E.G., MEASURE f_hi) ~208

COMPUTE TOTAL CAPACITANCE BASED ON Isource, Isink,
f_hi, f_lo, AND AMOUNT OF THRESHOLD VOLTAGE ADJUSTMENT ~210

*FIG. 10*

CAPACITANCE MEASUREMENT CIRCUITRY FOR A RESONANT TANK

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through one or more power amplifiers, which are configured to amplify low power analog signals to higher power signals more suitable for transmission through the air over long distances. A radio-frequency power amplifier can include multiple switched capacitors. The value of the switched capacitors can vary greatly due to process variations, which can impact frequency characteristics and the maximum achievable output power of the power amplifiers. It is within this context that the embodiments herein arise.

SUMMARY

An electronic device may include wireless communications circuitry. The wireless communications circuitry can include one or more processors or signal processing blocks for generating baseband signals, a transceiver for receiving the digital signals and for generating corresponding radio-frequency signals, one or more radio-frequency amplifiers configured to amplify the radio-frequency signals for transmission by one or more antennas in the electronic device, and one or more radio-frequency digital-to-analog converters (RFDACs) configured to convert a digital baseband signal into a corresponding analog radio-frequency signal. The radio-frequency amplifiers, the RFDACs, and/or other circuitry within the electronic device can include one or more switched capacitors.

An aspect of the disclosure provides circuitry that includes a transformer having a primary coil and a secondary coil, first capacitors coupled to a first terminal of the primary coil, second capacitors coupled to a second terminal of the primary coil, and capacitance measurement circuitry coupled to a center tap of the primary coil and configured to measure a capacitance of the first and second capacitors. The circuitry can include a first switch having a first terminal coupled to the center tap of the primary coil and having a second terminal configured to receive a bias voltage and a second switch having a first terminal coupled to the center tap of the primary coil and having a second terminal coupled to the capacitance measurement circuitry. The capacitance measurement circuitry can include a current source selectively coupled to the second terminal of the second switch, a third switch coupled between the current source and the second terminal of the second switch, a current sink selectively coupled to the second terminal of the second switch, a fourth switch coupled between the current sink and the second terminal of the second switch, a fifth switch coupled between the current source and a ground power supply line, and a sixth switch coupled between the current sink and a positive power supply line.

The capacitance measurement circuitry can further include a comparator having a first input coupled to the second terminal of the second switch and configured to generate a comparator output signal, where the fourth switch is configured to receive the comparator output signal and where the third switch is configured to receive an inverted version of the comparator output signal. The capacitance measurement circuitry can further include a chain of resistors configured to provide first and second threshold voltages to the first and second inputs of the comparator. Assuming the resistors are well matched and the supply voltage powering the resistive chain is known, the first and second threshold voltages can be calculated from the ratio of the resistance values and the known supply voltage. The use of a chain of resistors to generate the threshold voltages is exemplary. If desired, other voltage generation circuits such as a bandgap reference, a voltage regulator, or other bias voltage generators can be used to output two or more threshold/reference voltages that are selectively provided to one of the inputs of the comparator.

The capacitance measurement circuitry can further include a counter configured to receive the comparator output signal and to output a corresponding frequency of the comparator output signal and a capacitance calculation circuit configured to compute the capacitance of the first and second capacitors based on a current level of the current source, a current level of the current sink, a first frequency value measured when a voltage difference between a first threshold voltage at the first node along the chain of resistors and a second threshold voltage at the second node along the chain of resistors is at a first value, and a second frequency value measured when the voltage difference is at a second value different than the first value.

An aspect of the disclosure provides a method of operating a radio-frequency circuit having a transformer with a primary coil and a secondary coil. The method can include selectively coupling a center tap of the primary coil to a bias voltage during a normal mode, where the primary coil has a first terminal coupled to a first plurality of capacitors and has a second terminal coupled to a second plurality of capacitors, decoupling the center tap of the primary coil from the bias voltage and selectively coupling the center tap of the primary coil to capacitance measurement circuitry during a measurement mode, and using the capacitance measurement circuitry to measure a capacitance of the first and second pluralities of capacitors during the measurement mode. The method can further include selectively coupling a current source to a node coupled to the center tap of the primary coil during a charging phase of the measurement mode and selectively coupling a current sink to the node coupled to the center tap of the primary coil during a discharging phase of the measurement mode.

An aspect of the disclosure provides wireless circuitry that includes a balun having a primary coil and a secondary coil, the secondary coil having a first terminal coupled to a radio-frequency circuit and having a second terminal coupled to a ground line, a first plurality of switchable capacitors coupled to a first terminal of the primary coil, a second plurality of switchable capacitors coupled to a second terminal of the primary coil, a current source selectively coupled to a center tap of the primary coil during a charging phase, and a current sink selectively coupled to the center tap of the primary coil during a discharging phase. The wireless circuitry can further include a comparator having a first input selectively coupled to the center tap of the primary coil and having an output on which a comparator output signal is generated, a resistive divider configured to selectively provide a plurality of threshold voltages to a second input of the comparator, and a frequency measurement unit coupled to the output of the comparator and configured to output a frequency of the comparator output signal.

BRIEF DESCRIPTION OF THE DRAWINGS

FIG. 10 is a flow chart of illustrative steps for operating capacitance measurement circuitry of the type shown in connection with FIGS. 4-9 in accordance with some embodiments.

DETAILED DESCRIPTION

Figure 1:
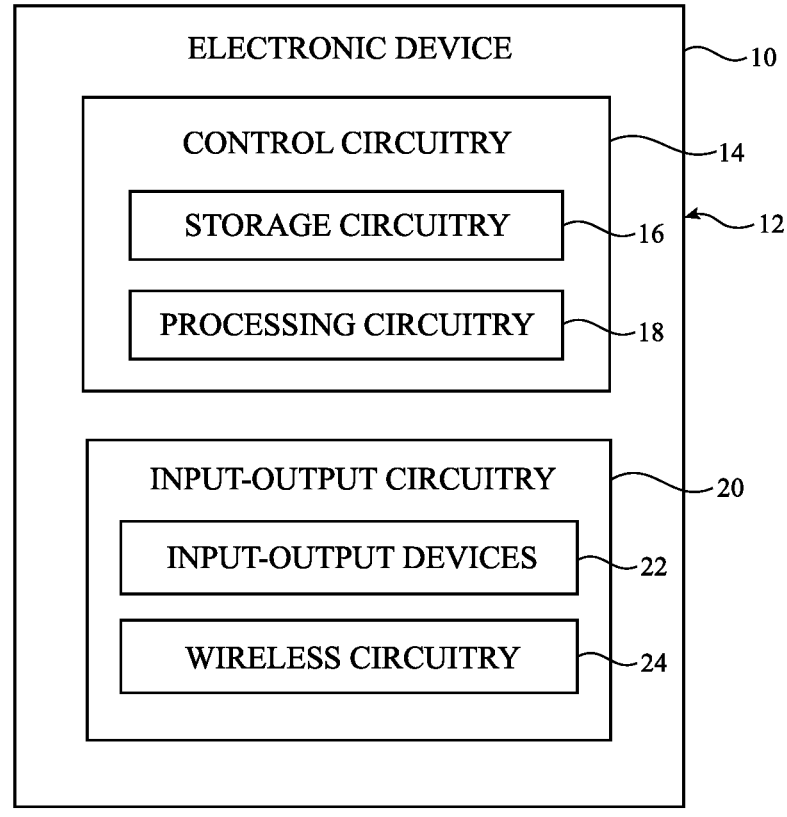
FIG. 1 is a diagram of an illustrative electronic device having wireless circuitry in accordance with some embodiments.

An electronic device such as device 10 of FIG. 1 may be provided with wireless circuitry. The wireless circuitry may include a processor for generating baseband signals, an upconversion circuit for upconverting (mixing) the baseband signals into radio-frequency signals, a radio-frequency amplifier for amplifying the radio-frequency signals, and an antenna for radiating the amplified radio-frequency signals.

Radio-frequency (RF) circuits can sometimes include a resonant tank. For example, switched capacitor based RF power amplifiers and RF digital-to-analog converters can include an output stage having a plurality of capacitors. Due to process variations, the size of the capacitors may vary, which can directly impact the performance of the radio-frequency circuits that include these capacitors. It would therefore be desirable to measure the total capacitance of these capacitors. The capacitors are, however, not directly accessible for measurement as they are connected to an inductor of the resonant tank, which prevents a dedicated measurement circuit to be attached to the capacitors.

In accordance with an embodiment, capacitance measurement circuitry is provided that is connected to a center tap of an inductor (or balun) in a resonant tank. Since the center tap is an RF neutral point, connecting the capacitance measurement circuitry in this way does not affect the high frequency operation of the resonant tank. The capacitance measurement circuitry can be implemented to function as part of a relaxation oscillator. The capacitance measurement circuitry can include a comparator configured to receive different threshold voltages, a current source switched into use during a charging phase, a current sink switched into used during a discharging phase, and associated switches for switching between the charging phase and the discharging phase. Operated in this way, the capacitance measurement circuit can output a periodic signal with a frequency value, which can then be used to compute the total capacitance of the capacitors. This method is technically advantageous and beneficial as it provides fast capacitance measurement without having to directly access the capacitors in the resonant tank.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHZ), a 5 GHz WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
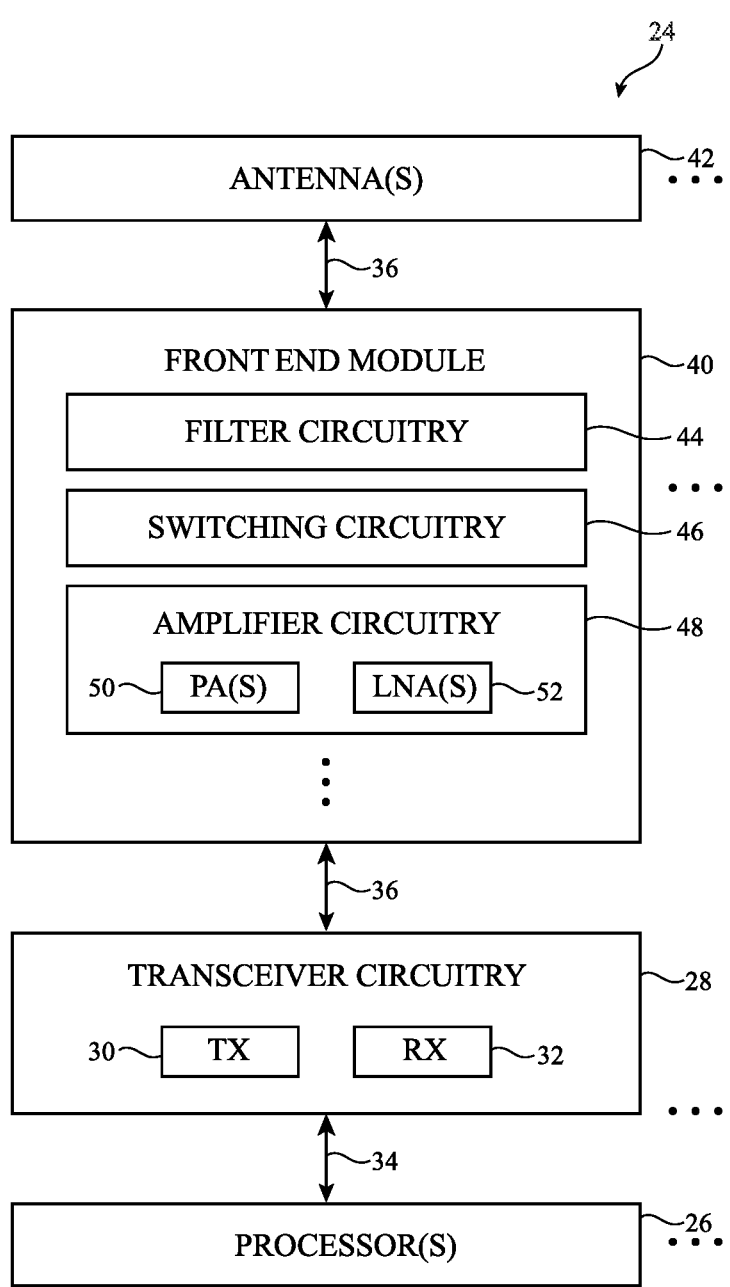
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHZ), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier, transmit amplifier, or amplifier) may be configured to amplify a radio-frequency signal without changing the signal shape, format, or modulation. Amplifier 50 may, for example, be used to provide 10 dB of gain, 20 dB of gain, 10-20 dB of gain, less than 20 dB of gain, more than 20 dB of gain, or other suitable amounts of gain.

Figure 3:
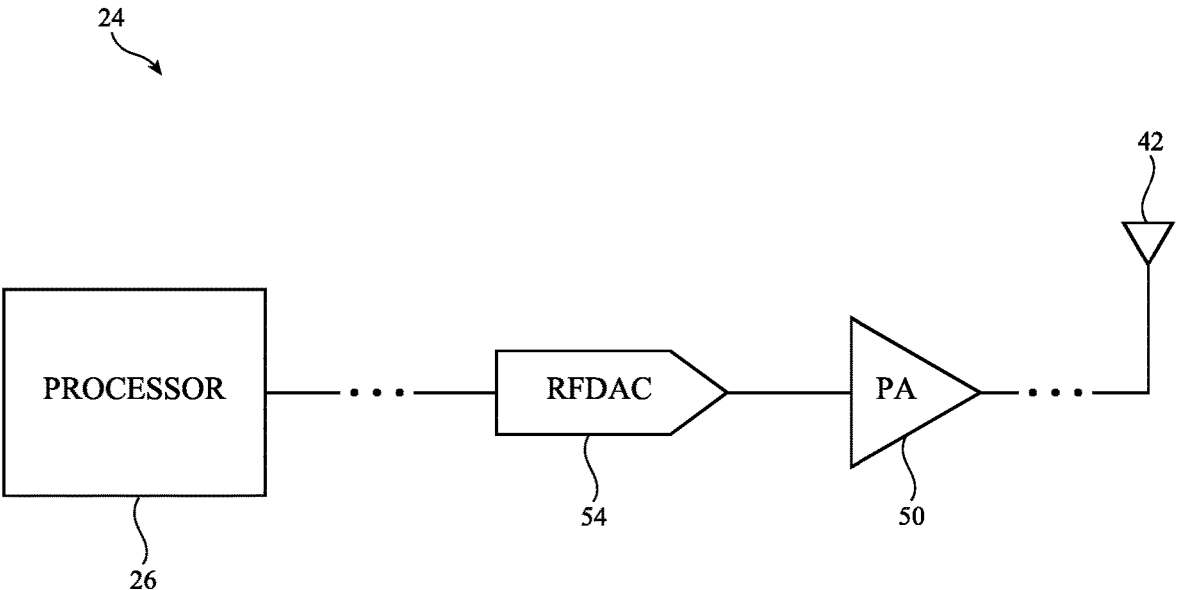
FIG. 3 is a diagram of illustrative transmit circuitry in accordance with some embodiments.

FIG. 3 is a diagram of an illustrative transmit path of wireless circuitry 24 in accordance with some embodiments. As shown in FIG. 3, wireless circuitry 24 may include processor 26, a radio-frequency converter block such as radio-frequency converter block 54, a radio-frequency power amplifier such as radio-frequency amplifier 50, and an antenna 42 configured to radiate radio-frequency signals output from amplifier 50. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18 of FIG. 1. Processor 26 may be configured to generate a digital baseband signal. The baseband signal is sometimes referred to as a digital signal or a transmit signal. As examples, the baseband signal generated by processor 26 may include in-phase (I) and quadrature-phase (Q) signals, radius and phase signals, a vector input, or other digitally coded signals.

Radio-frequency converter block 54 may be configured to convert the digital baseband signal from the digital domain to the analog domain and to upconvert (modulate) the analog signals to radio frequencies. The term "radio-frequency converter" may thus refer to and be defined herein as a circuit that can perform both signal domain conversion (e.g., digital to analog conversion) and frequency upconversion (e.g., from baseband frequencies to radio frequencies or intermediate frequencies). Baseband frequencies can range from a couple hundred Hz to a couple hundred MHz. The input of amplifier 50 configured to receive radio-frequency signals can be referred to or defined herein as a radio-frequency input (port). Radio frequencies can range from hundreds of MHz to tens of GHz. Radio-frequency converter block 54 may output a radio-frequency signal to the radio-frequency input of amplifier 50. Radio-frequency amplifier 50 may generate a corresponding amplified radio-frequency signal that can then be radiated by antenna(s) 42.

The example described above in which converter block 54 performs digital-to-analog conversion before conducting frequency upconversion in the analog domain is illustrative. In another embodiment, RF converter block 54 can perform frequency upconversion in the digital domain before conducting digital-to-analog conversion. In general, RF converter block 54 may include a plurality of M individual digital-to-analog converters, each of which is sometimes referred to or defined herein as a radio-frequency DAC ("RFDAC") or RFDAC cell (e.g., converter block 54 can include M separate radio-frequency DACs). For example, M can be any integer greater than four, four to ten, greater than 10, 10 to 20, greater than 20, or other integer value.

Figure 4:
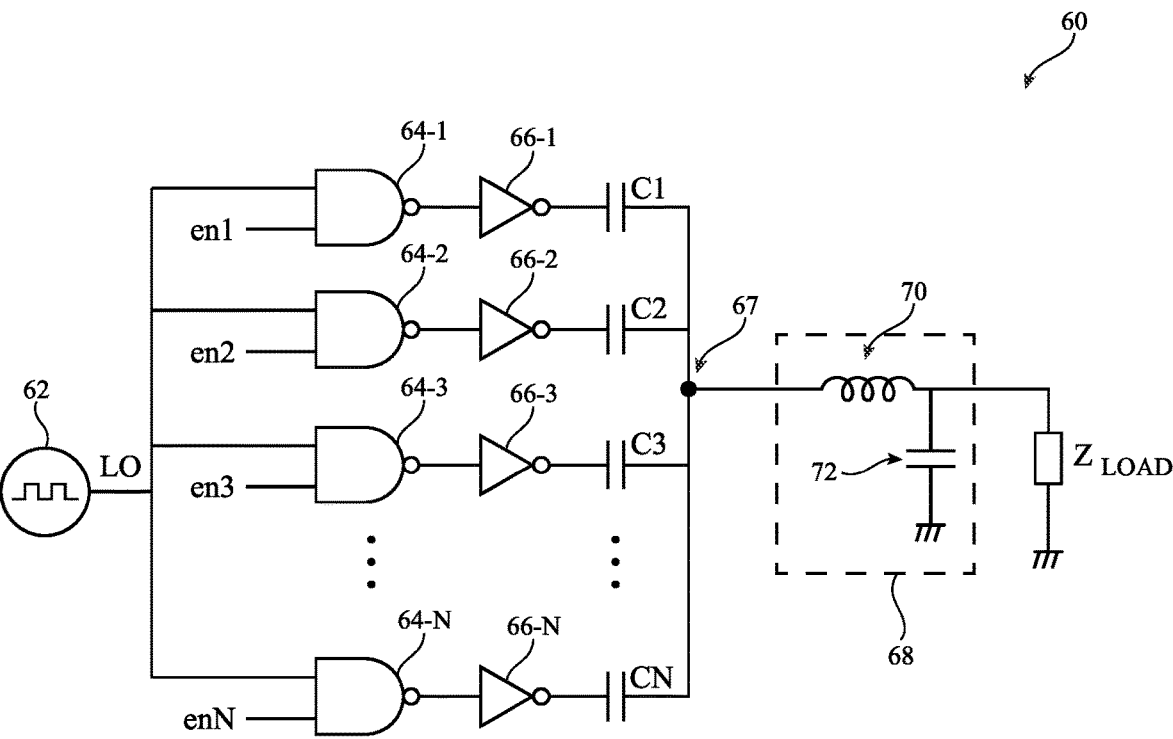
FIG. 4 is a circuit diagram of an illustrative switched capacitor based radio-frequency circuit in accordance with some embodiments.

If desired, one or more radio-frequency circuits in wireless circuitry 24 can be implemented as a switched capacitor based RF circuit. As an example, RF converter block 54 can be implemented as a switched capacitor based circuit and can thus be referred to as a switched capacitor based RFDAC block. As another example, radio-frequency amplifier 50 can be implemented as a switched capacitor based circuit and can thus be referred to as a switched capacitor based RF amplifier. FIG. 4 is a circuit diagram of an illustrative switched capacitor based radio-frequency circuit 60 in accordance with some embodiments. Switched capacitor based RF circuit 60 of FIG. 4 can generically represent a switched capacitor based RFDAC block, a switched capacitor based power amplifier, or other radio-frequency circuit having one or more capacitors.

As shown in FIG. 4, radio-frequency circuit 60 may include N drivers coupled to N respective capacitors. A first driver that includes a first logic gate such as first logic NAND gate 64-1 coupled in series with a first inverter 66-1 can be used to drive a first capacitor C1. The first logic NAND gate 64-1 may have a first input configured to receive an oscillating signal LO from a local oscillator 62 and a second input configured to receive a first enable signal en1. Local oscillator 62 can include an on-chip clock signal generator (e.g., a phase-locked loop), an off-chip crystal oscillator, and/or other types of signal generator for outputting a clock signal, a sinusoidal waveform, or other periodic signal.

A second driver that includes a second logic gate such as logic NAND gate 64-2 coupled in series with a second inverter 66-2 can be used to drive a second capacitor C2. The second logic NAND gate 64-2 may have a first input configured to receive signal LO from oscillator 62 and a second input configured to receive a second enable signal en2. A third driver that includes a third logic gate such as logic NAND gate 64-3 coupled in series with a third inverter 66-3 can be used to drive a third capacitor C3. The third logic NAND gate 64-3 may have a first input configured to receive signal LO from oscillator 62 and a second input configured to receive a third enable signal en3. An $N^{th}$ driver that includes an $N^{th}$ logic gate such as logic NAND gate 64-N coupled in series with an $N^{th}$ inverter 66-N can be used to drive an $N^{th}$ capacitor CN. The $N^{th}$ logic NAND gate 64-N may have a first input configured to receive signal LO from oscillator 62 and a second input configured to receive an $N^{th}$ enable signal enN. In general, N can be 1-10, 10-50, 50-100, 100-1000, more than 1000, or any other integer.

Enable signals en1, en2, en3 . . . and enN may be part of a digital code that controls which of the N capacitors are switched into use. In general, the enable signals can selectively activate on or more of the N capacitors. The N capacitors (e.g., capacitors C1, C2, C3, . . . , CN) can each have the same size (capacitance) or different sizes and may all be coupled to a common node 67. At the common node 67, the oscillating signal LO develops a radio-frequency voltage signal that is proportional to the ratio of activated drivers/capacitors to the total number of drivers/capacitors N. Node 67 is therefore sometimes referred to as a signal summing node. A matching circuit such as an impedance matching circuit 68 may be coupled between node 67 and a corresponding load represented by load $Z_{LOAD}$. Load $Z_{LOAD}$ can represent the input impedance of a circuit coupled at the output of radio-frequency circuit 60. Matching circuit 68 can include passive components such as an inductor 70 and a capacitor 72. Inductor 70 can have a first terminal coupled to node 67 and a second terminal coupled to load $Z_{LOAD}$, whereas capacitor 72 can have a first terminal coupled to the second terminal of inductor 70 and a second terminal coupled to ground.

Configured in this way, inductor 70 and all of the N capacitors can collectively form a resonant tank for circuit 60. The term "resonant tank" can refer to and be defined herein as a resonant circuit having an inductor and the N parallel capacitors connected together, where these components exhibit values that are chosen to allow the tank to resonate at a particular (resonant) frequency. When a resonant tank is driven by a power source at its resonant frequency, energy can oscillate back and forth between the inductor and the capacitors. This oscillation or exchange of energy stored in the resonant tank creates a sinusoidal waveform with a resonant frequency that is a function of the values of the inductor and capacitors. For example, the resonant frequency may be inversely proportional to the square root of the product of the inductance of the inductor and the capacitance of the capacitors in the resonant tank.

The N selectively activated/driven capacitors, sometimes referred to collectively as switched or switchable capacitors, in circuit 60 can exhibit capacitances that vary significantly from their intended values due to process variations that arise during the fabrication process. This variation in the capacitance can impact the resonant frequency of the resonant tank and can limit the maximum achievable output power of circuit 60. It would therefore be desirable to measure the total capacitance of the capacitors post fabrication to account for the process variations. The switched capacitors, however, are not directly accessible for measurement as they are connected to inductor 70, which does not allow for a dedicated measurement circuit to be directly connected to the common node 67.

Figure 5:
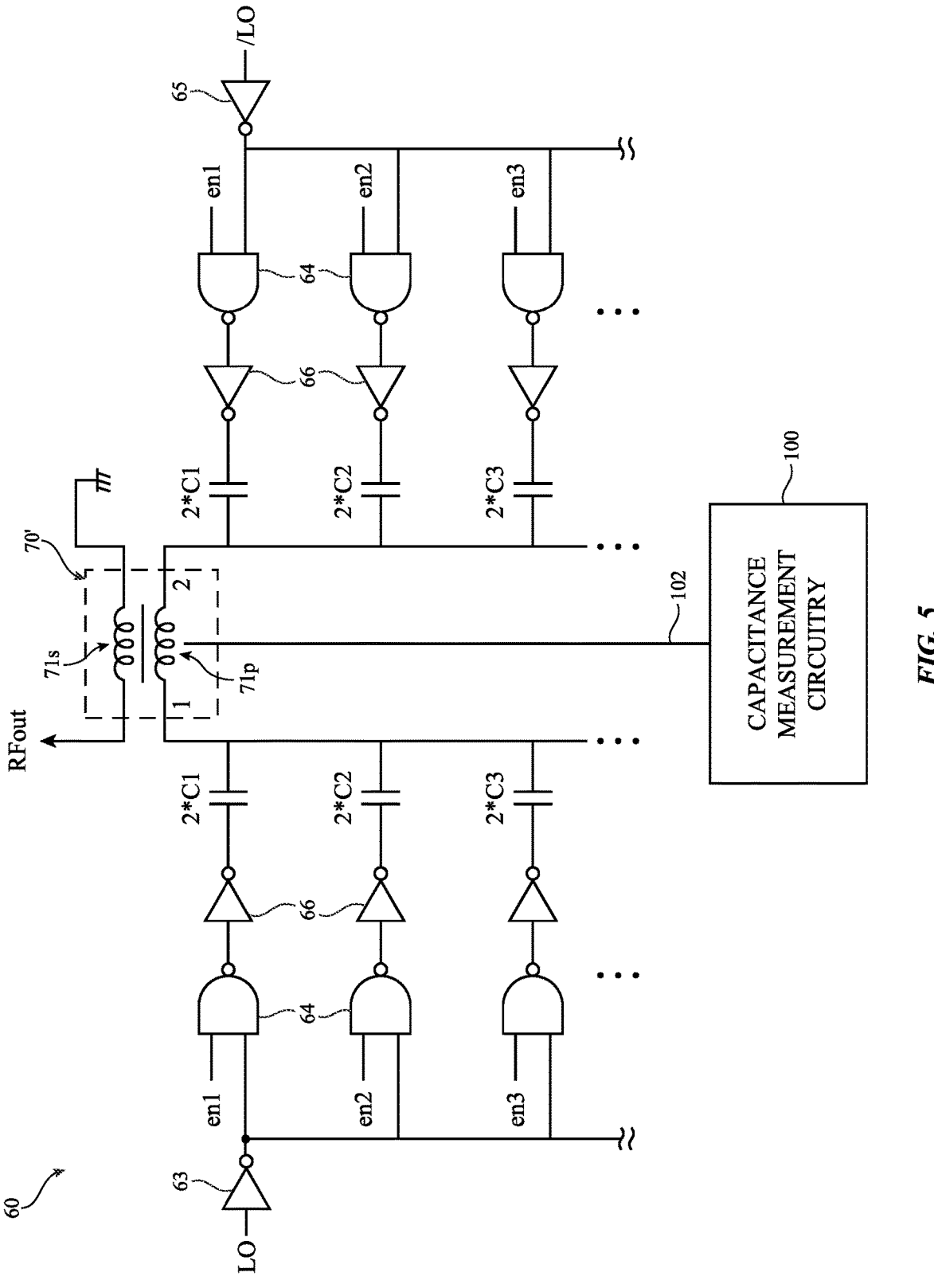
FIG. 5 is a diagram showing how capacitance measurement circuitry can be coupled to a transformer associated with a switched capacitor based radio-frequency circuit in accordance with some embodiments.

The single-ended radio-frequency switched capacitor based circuit 60 of FIG. 4 is exemplary. In practice, the switch capacitor based circuit can be implemented as a differential circuit in which the inductor 70 is implemented as a balun (see, e.g., FIG. 5). As shown in FIG. 5, switched capacitor based circuit 60 includes an output stage having a balun 70'. Balun 70' is sometimes referred to as a transformer configured to convert between balanced and unbalanced signals. Balun 70' may include a primary coil 71p and a secondary coil 71s. Primary coil 71p may sometimes be referred to as a primary winding or inductor, whereas secondary coil 71s may sometimes be referred to as a secondary winding or inductor. Secondary coil 71s may have a first terminal coupled to an output terminal (e.g., a radio-frequency output terminal coupled to a load circuit) and a second terminal coupled to ground.

Primary coil 71p may have a first terminal that is coupled to a first group of drivers and capacitors and a second terminal that is coupled to a second group of drivers and capacitors. Compared to the single-ended embodiment of FIG. 4, each capacitor in the two groups in the example of FIG. 5 should be doubled in value since each capacitor would be coupled in series with coil 71p when operating at the resonant frequency. The first group of drivers and capacitors can include N drivers coupled to N respective capacitors. A first driver that includes a first logic NAND gate 64 coupled in series with a first inverter 66 to drive a first capacitor with capacitance 2*C1. The first logic NAND gate 64 can have a first input configured to receive an inverted oscillating signal via inverter 63 and a first enable signal en1. A second driver that includes a second logic NAND gate 64 coupled in series with a second inverter 66 to drive a second capacitor with capacitance 2*C2. The second logic NAND gate 64 can have a first input configured to receive the inverted oscillating signal via inverter 63 and a second enable signal en2. Additional drivers and capacitors that are coupled to the first terminal of coil 71p can be selectively activated using a digital code that includes the enable signals.

Similarly, the second group of drivers and capacitors can also include N drivers coupled to N respective capacitors. A first driver that includes a first logic NAND gate 64 coupled in series with a first inverter 66 to drive a first capacitor with capacitance 2*C1. The first logic NAND gate 64 can have a first input configured to receive an inverted version of signal/LO via inverter 65 and a first enable signal en1. Signal/LO may represent an inverted version of oscillating signal LO. A second driver that includes a second logic NAND gate 64 coupled in series with a second inverter 66 to drive a second capacitor with capacitance 2*C2. The second logic NAND gate 64 can have a first input configured to receive an inverted version of/LO via inverter 63 and a second enable signal en2. Additional drivers and capacitors that are coupled to the second terminal of coil 71p can be selectively activated using the digital code that includes the enable signals. Configured in this way, the two terminals of primary coil 71p is symmetrically loaded.

In some embodiments, primary coil 71p of balun 70' can have a center tap terminal coupled to a mid-level bias voltage to prevent an uncontrolled floating potential at the primary side, which can mitigate oxide stress and electrical damage of balun 70'. Biasing the center tap of primary coil 71p does not affect the radio-frequency behavior of the overall resonant tank since the center tap terminal of coil 71p is an RF neutral (cold) point that carries no radio-frequency signal. In accordance with an embodiment, the center tap of primary coil 71p of balun 70' can be coupled to measurement circuitry such as capacitance measurement circuitry 100 via path 102. Arranged in this way, capacitance measurement circuitry 100 can be configured to indirectly measure the overall (total) capacitance of the switched capacitors. Since the center tap of primary coil 71p is an RF neutral node, connecting capacitance measurement circuitry 100 to this RF neutral node would not negatively impact the radio-frequency operation of the overall resonant tank.

Figure 6:
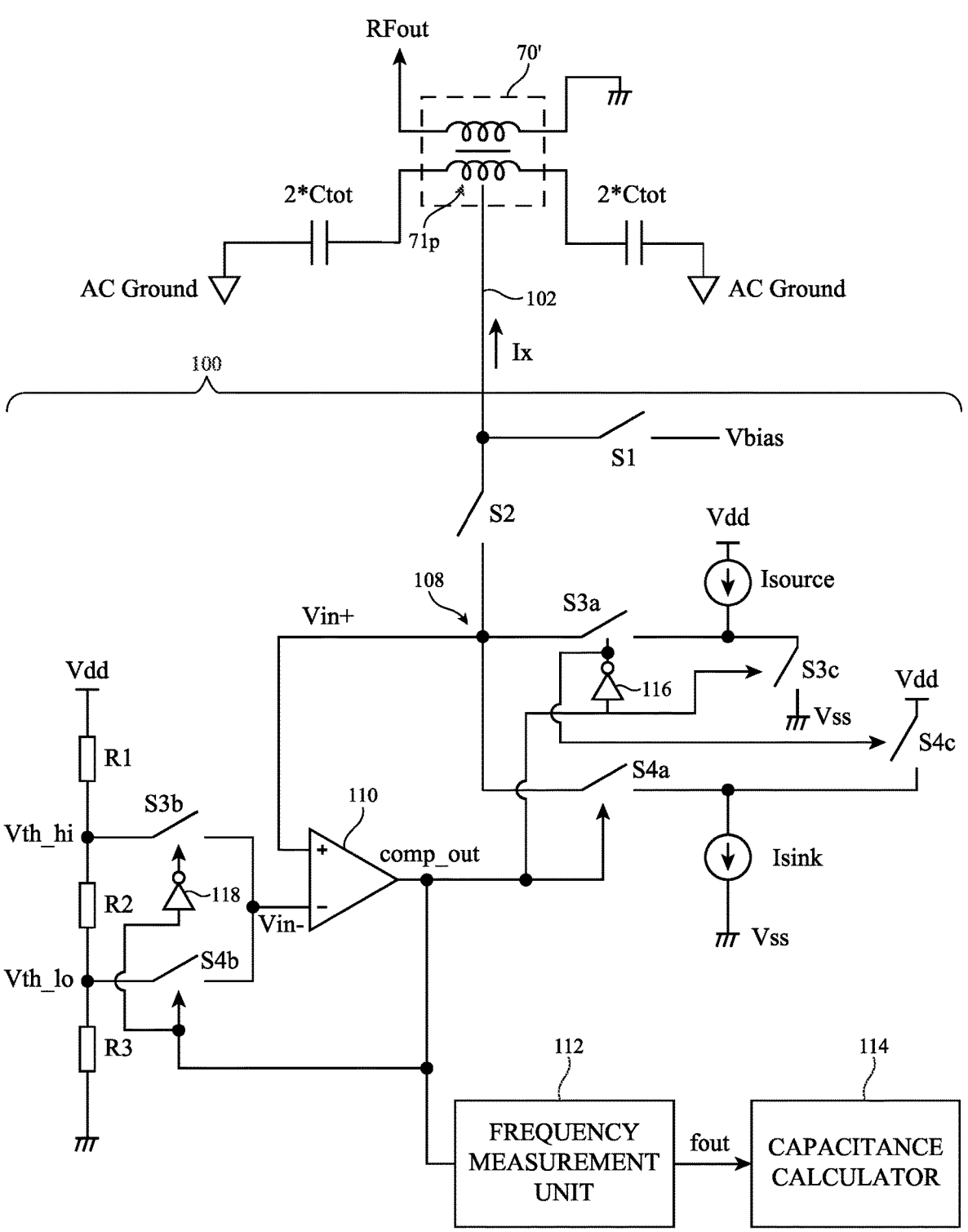
FIG. 6 is a circuit diagram of illustrative capacitance measurement circuitry in accordance with some embodiments.

FIG. 6 is a circuit diagram of illustrative capacitance measurement circuitry 100. To measure the total capacitance of the switched capacitors, the enable signals can all be set to logic zero. Driving the enable signals to zero volts effectively shunts all of the switched capacitors to an AC (alternating current) ground. Alternatively or in addition to setting the enable signals to logic zero, signals LO and/LO can also be deactivated (e.g., by setting signals LO and/LO to a constant logic zero or logic one). Capacitance Ctot represents the sum of the individual capacitances (e.g., Ctot may be equal to C1+C2+C3+ . . . +CN). As shown in FIG. 6, capacitance measurement circuitry 100 may include a comparator circuit such as comparator 110, a current source such as current source Isource, a current sink such as current sink Isink, resistive elements such as resistors R1, R2, and R3, switches such as switches S1, S2, S3a, S3b, S4a, and S4b, a frequency measurement circuit such as frequency measurement unit 112, and a capacitance calculation circuit such as capacitance calculator 114.

Switch S1 may have a first terminal coupled to the center tap of coil 71p via path 102 and may have a second terminal configured to receive a bias voltage Vbias. Switch S1 may be considered to be part of or separate from capacitance measurement circuitry 100. Voltage Vbias may have a voltage level chosen to mitigate oxide stress and electrical damage of balun 70'. Voltage Vbias may be equal to a ground power supply voltage, a positive power supply voltage, an intermediate voltage between the ground power supply voltage and the positive power supply voltage, a low voltage less than the ground power supply voltage, or a high voltage greater than the positive power supply voltage. The current flowing into the center tap terminal of coil 71p may be defined as current Ix.

Switch S2 may have a first terminal coupled to the center tap of coil 71p via path 102 and may have a second terminal coupled to a node 108. Switch S2 may be considered part of capacitance measurement circuitry 100 or may be considered separate from capacitance measurement circuitry 100. If switch S2 is considered to be separate from circuitry 100, then switch S2 can be said to have a first terminal coupled to the center tap of primary coil 71p and a second terminal coupled to capacitance measurement circuitry 100. Current source Isource may have a first terminal coupled to a positive power supply line (e.g., a power supply terminal on which positive power supply voltage Vdd is provided) and may have a second terminal coupled to node 108 via switch S3a. Current sink Isink may have a first terminal coupled to a ground power supply line (e.g., a ground terminal on which ground power supply voltage Vss is provided) and may have a second terminal coupled to node 108 via switch S4a. The embodiment of FIG. 6 in which Isource is coupled to the Vdd positive power supply line and Isink is coupled to the Vss ground power supply line is illustrative. In other embodiments, current source Isource can be coupled to other voltage or bias line configured to provide a source of current. Similarly, current sink Isink can be coupled to other voltage or bias line configured to provide a node to sink current.

Comparator 110 may have an output on which a comparator output signal comp_out is generated, a first (positive) input coupled to node 108, and a second (negative) input. Since node 108 is coupled to the positive input of comparator 110, the voltage at node 108 can be referred to as voltage Vin+, whereas the voltage at the negative input of comparator 110 can be referred to as voltage Vin−. The output of comparator 110 can be referred to as the comparator output port. Switch S4a may be controlled by the comparator output signal comp_out (e.g., signal comp_out can be asserted or driven high to activate switch S4a and can be deasserted or driven low to deactivate switch S4a). Switch S3a may be controlled by an inverted version of the comparator output signal comp_out that is fed through inverter 116 (e.g., signal comp_out can be deasserted or driven low to activate switch S3a and can be asserted or driven high to deactivate switch S3a). The term "activate" with respect to a switch (or transistor) may refer to or be defined herein as an action that places the switch in an on or low-impedance state such that the two terminals of the switch are electrically connected to conduct current. The term "deactivate" with respect to a switch (or transistor) may refer to or be defined herein as an action that places the switch in an off or high-impedance state such that the two terminals of the switch are electrically disconnected with minimal leakage current.

The second (−) input of comparator 110 may be selectively coupled to different points along a resistive divider formed from resistors R1, R2, and R3. Resistors R1, R2, and R3 can be coupled in series to form a chain of resistors between the positive power supply line and the ground line.

A first (high) threshold voltage Vth_hi can be provided at the node interposed between resistors R1 and R2. A second (low) threshold voltage Vth_lo can be provided at the node interposed between resistors R2 and R3. First threshold voltage Vth_hi is greater than second threshold voltage Vth_lo. Resistors R1, R2, and R3 can have the same resistance values or different resistance values that are chosen to set voltages Vth_hi and Vth_lo at the desired levels. Resistors R1, R2, and R3 can have fixed (static) resistances or adjustable resistances. As an example, threshold voltages Vth_hi and Vth_lo can be set equal to 600 mV and 400 mV, respectively. This is merely illustrative. In general, threshold voltage Vth_hi can be in the range of 500-700 mV, greater than 600 mV, greater than 700 mV, less than 600 mV, or other voltage greater than Vth_lo. On the other hand, threshold voltage Vth_lo can be in the range of 300-500 mV, less than 500 mV, less than 400 mV, less than 300 mV, less than 200 mV, or other voltage less than Vth_hi.

Assuming resistors R1, R2, and R3 are well matched physically and the supply voltage Vdd is known, threshold voltages Vth_hi and Vth_lo can be calculated from the ratio of the resistance values and the known supply voltage Vdd. In scenarios where these resistors might not be well matched, the threshold voltages Vth_hi and Vth_lo can be measured or determined by other suitable means. For example, the threshold voltages Vth_hi and Vth_lo can optionally be measured by selectively feeding out Vth_hi and Vth_lo to a separate measurement unit via one or more additional switches.

The use of a chain of resistors R1, R2, and R3 to generate the threshold voltages as shown in FIG. 6 is illustrative. If desired, other types of voltage generation circuits such as a bandgap reference, a voltage regulator, or other bias voltage generators can be used to output two or more threshold/ reference voltages that are selectively provided to the second input of comparator 110. The voltages that are received at the second input of comparator 110 can also sometimes be referred to as reference voltages. The threshold or reference voltage(s) provided to the second input of comparator 110 can also be tapped from other known internal bias voltage(s). In general, the circuit that is used to generate the threshold or reference voltages can be referred to and be defined therein as a threshold voltage generation circuit or a reference voltage generation circuit.

Switch S3b may have a first terminal configured to receive threshold voltage Vth_hi and may have a second terminal coupled to the second (−) input of comparator 110. Switch S4b may have a first terminal configured to receive threshold voltage Vth_lo and may have a second terminal coupled to the second (−) input of comparator 110. Switch S4b may be controlled by the comparator output signal comp_out (e.g., signal comp_out can be asserted or driven high to activate switch S4b and can be deasserted or driven low to deactivate switch S4b). Switch S3b may be controlled by an inverted version of the comparator output signal comp_out that is fed through inverter 118 (e.g., signal comp_out can be deasserted or driven low to activate switch S3b and can be asserted or driven high to deactivate switch S3b).

The output of comparator 110 may be coupled to frequency measurement unit 112. During a measurement phase, the comparator output signal comp_out can oscillate at some frequency. Frequency measurement unit 112 can detect the oscillation frequency of signal comp_out and generate a corresponding output frequency fout. Frequency measurement unit 112 can be implemented as a counter (as an example), a period duration measurement circuit, or other type of frequency measurement circuit. Capacitance calculator 114 may have an input configured to receive frequency fout from frequency measurement unit 112 and may be configured to compute the total capacitance value Ctot based on at least the measurement frequency fout.

Figure 7:
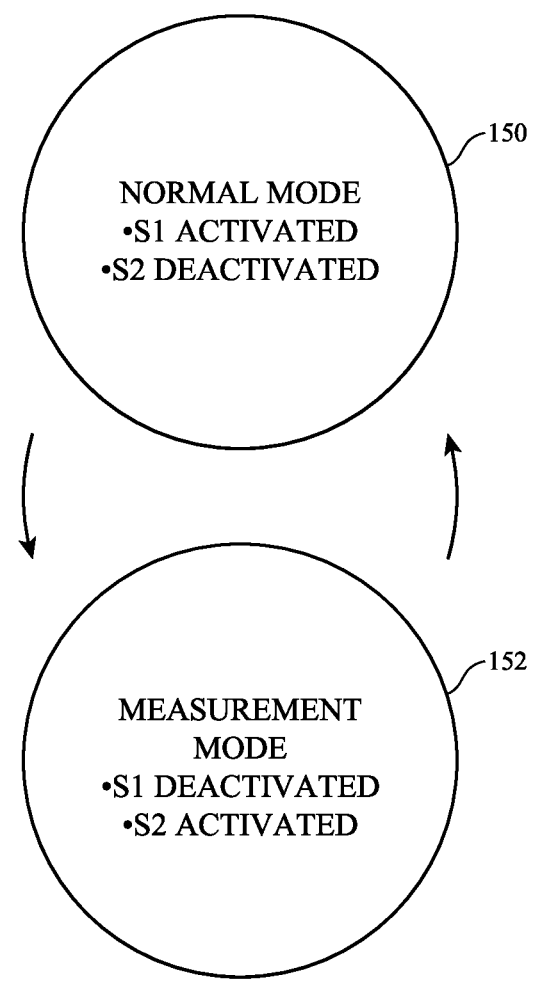
FIG. 7 is a state diagram showing how the capacitance measurement circuitry of FIG. 6 can be operable in a normal mode and a measurement mode in accordance with some embodiments.

FIG. 7 is a state diagram showing how capacitance measurement circuitry 100 of FIG. 6 can be operable in a normal mode 150 and a measurement mode 152 in accordance with some embodiments. When operating in the normal mode 150, switch S1 can be activated (turned on) to connect the center tap terminal of coil 71*p* to Vbias while switch S2 is deactivated (turned off) to switch capacitance measurement circuitry 100 out of use. When operating in the measurement mode 152, switch S1 can be deactivated to decoupled voltage Vbias while switch S2 is activated to connect the center tap terminal of coil 71*p* to capacitance measurement circuitry 100. During measurement mode 152, all of the enable signals controlling the capacitance drivers are deasserted (e.g., driven low).

Figure 8:
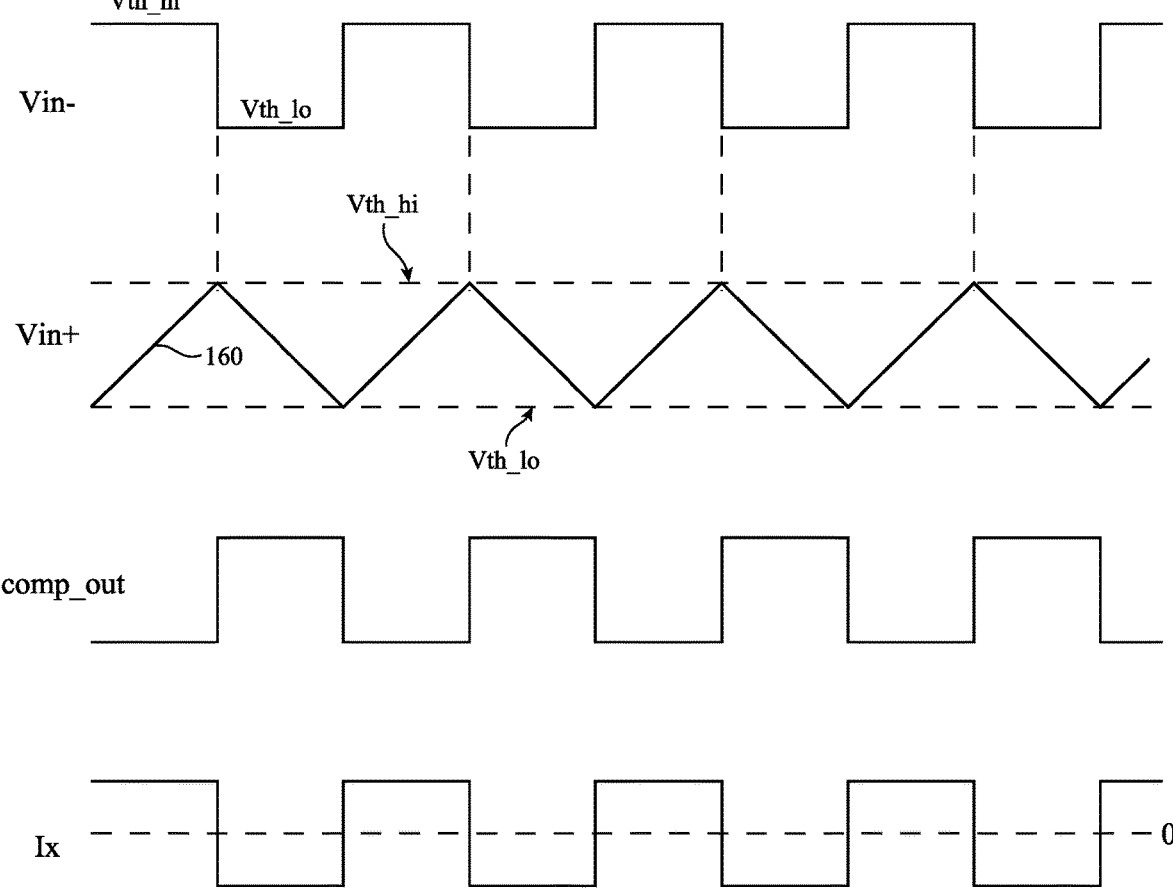
FIG. 8 is a timing diagram showing relevant waveforms involved in the operation of the capacitance measurement circuitry of FIG. 6 in accordance with some embodiments.

FIG. 8 is a timing diagram showing relevant waveforms involved in the operation of the capacitance measurement circuitry 100 of the type described in connection with FIG. 6. Voltage Vin-shows the waveform at the second (negative) input port of comparator 110. Voltage Vin+ shows the waveform at the first (positive) input port of comparator 110. Signal comp_out shows the waveform at the output port of comparator 110. Signal Ix shows the waveform of the current flowing into the center tap terminal of primary coil 71*p*. The state of the comparator output signal comp_out determines which of switches S3*a*, S3*b*, S4*a*, and S4*b* are activated.

When the comparator output signal comp_out is asserted (driven high), switch S4*b* is activated to pass threshold voltage Vth_lo to the negative input of comparator 110 while switch S4*a* is activated to connect node 108 to current sink Isink. When current Isink is switched into use, voltage Vin+ at node 108 will discharge or ramp down linearly at a rate proportional to the current amount Isink (see Vin+ waveform 160). During this time, current Ix will also be negative since Isink will draw current downwards toward the ground line. When voltage Vin+ falls below threshold voltage Vth_lo, comparator 110 will flip, which causes comparator output signal comp_out to toggle or change its value. During this discharge phase while Vin+ is ramping down, current source Isource may be disconnected from node 108. To prevent the disconnected current source Isource from starving, Isource can be coupled to a dummy node such as the Vss ground line or other current sinking node using switch S3*c*. Switch S3*c* can be controlled by the comparator output signal comp_out. Configured in this way, switch S3*c* can be activated during the discharging phase to divert the current of Isource and deactivated during a charging phase (described below).

When the comparator output signal comp_out is deasserted (driven low), switch S3*b* is activated to pass threshold voltage Vth_hi to the negative input of comparator 110 while switch S3*a* is activated to connect node 108 to current source Isource. When current Isource is switched into use, voltage Vin+ at node 108 will charge or ramp up linearly at a rate proportional to the current amount Isource (see Vin+ waveform 160). During this time, current Ix will be positive since Isource will pump current toward the center tap terminal of coil 71*p* via path 102. When voltage Vin+ rises above threshold voltage Vth_hi, comparator 110 will flip, which causes comparator output signal comp_out to toggle or change its value. Operated in this way, capacitance measurement circuitry 100 alternates between a charge phase that ramps up Vin+ and a discharge phase that ramps down Vin+. This alternating operation between charge and discharge phases generates a triangular waveform 160 at node 108 that toggles between threshold voltages Vth_lo and Vth_hi. The charge phase is sometimes referred to as the charging phase, whereas the discharge phase is sometimes referred to as the discharging phase. During the charging phase while Vin+ is ramping up, current sink Isink may be disconnected from node 108. To prevent the disconnected current sink Isink from starving, Isink can be coupled to a dummy node such as the Vdd power supply line or other source node using switch S4*c*. Switch S4*c* can be controlled by an inverted version of the comparator output signal comp_out (e.g., the output of inverter 116). Configured in this way, switch S4*c* can be activated during the charging phase to divert the current of Isink and deactivated during the discharging phase.

At the same time, comparator output signal comp_out toggles between logic "1" and "0" at the same frequency of oscillation. Configured to operate in this way, capacitance measurement circuitry 100 along with coil 71*p* and the switched capacitors are sometimes collectively considered to form part of a relaxation oscillator. If the threshold voltages Vth_lo and Vth_hi and current levels Isource and Isink are known and fixed, the oscillation or resonant frequency of the relaxation oscillator will be determined by the total capacitance Ctot of the switched capacitors coupled directly to balun 70'. For example, the total capacitance Ctot can be computed using the following equation:

$$Ctot = Iconst / (8 * fout * \Delta Vth) \quad\quad (1)$$

where Iconst represents a constant current to which both Isource and Isink are set, where fout is equal to the oscillating frequency of the comparator output signal comp_out as determined by frequency measurement unit 112, and where $\Delta Vth$ is the difference between Vth_hi and Vth_lo (e.g., $\Delta Vth=Vth\_hi-Vth\_lo$). The voltage levels of Vth_hi and Vth_lo can be calculated based on known values or separately measured. If current level Iconst is chosen arbitrarily low, the frequency fout can be set such that possible delays due to switching and limited comparator bandwidth are neglected. A possible input offset voltage of comparator 110 is also negligible to the first order since the offset applies for both high and low threshold voltages. Thus, as long as the charging and discharging of node 108 occurs sufficiently slow and linearly, the comparator offset voltage can be considered mostly static and independent of the common mode voltage and will therefore cancel out. Only a shift in the average voltage of signal comp_out will take place, but frequency fout remains unaffected. For the same reason, as long as Isink and Isource are linear and comparator 110 operates between the two threshold voltage Vth_hi and Vth_lo, only the difference $\Delta Vth$ matters.

Currents Isource and Isink need not be at the same current level but using the same current levels (e.g., Isource=Isink=Iconst) can yield a symmetrical waveform 160 at the center tap node 108 to help suppress even order harmonic distortion components. Either way, the current levels for Isource and Isink should be known in order to precisely calculate the total capacitance based on the measured frequency. The current level(s) of Isource and Isink can be set by design (e.g., based on a predetermined current reference available on-chip) or can be measured using an on-die current measurement unit or using an external current meter. In the latter case, additional switching circuitry can be included to feed Isource and Isink to a separate measurement path coupled to the center tap path 102 or to node 108 directly. To force a static charge and discharge current during current measurement operations, the state of the comparator output signal comp_out and switches S3*a* and S4*a* can be overridden such that the feedback loop around the comparator is open and oscillation is prevented. As examples, Isource and/or Isink can have current levels in the range of 1-5 microamps (µA), 5-10 µA, 10-100 µA, more than 100 µA, less than 5 µA, or other current values.

Figure 9:
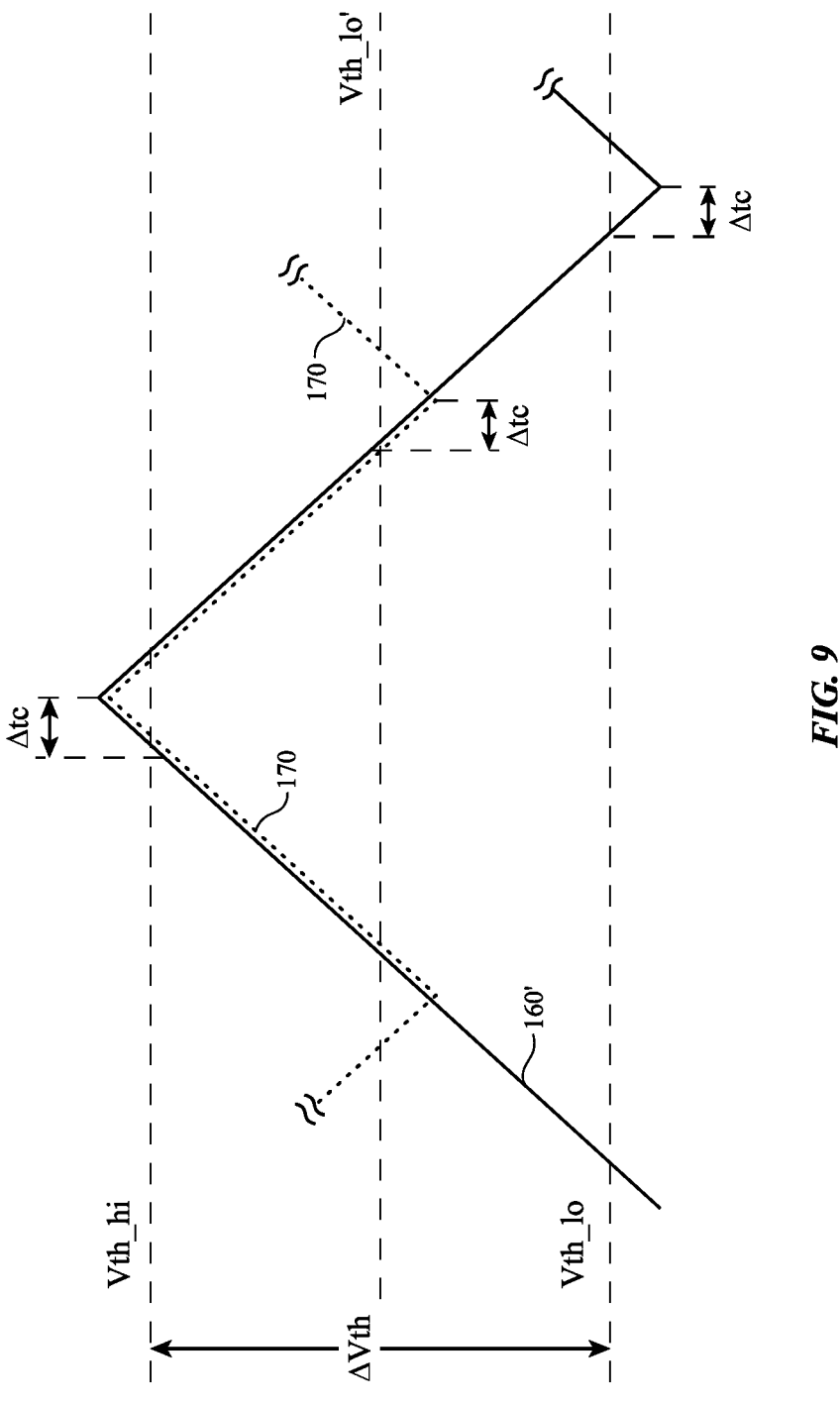
FIG. 9 is a timing diagram showing how a threshold voltage in the capacitance measurement circuitry of FIG. 6 can be adjusted to account for comparator delay in accordance with some embodiments.

Equation 1 above assumes that comparator delay is negligible (i.e., that the comparator flips or toggles immediately when voltage Vin+ exceeds threshold level Vth_hi or when voltage Vin-falls below threshold level Vth_lo as shown in FIG. 8). In practice, however, some amount of comparator delay may exist, which can impact the measurement accuracy of the resulting capacitance. FIG. 9 is a timing diagram that illustrates the voltage waveform at the first (positive) input of comparator 110 as indicated by waveform 160'. As shown in FIG. 9, Vin+ waveform 160' may start ramping down a comparator delay Δtc after waveform 160' exceeds the high threshold level Vth_hi and may start ramping up a comparator delay Δtc after waveform 160' falls below low threshold level Vth_lo. The difference between threshold voltages Vth_hi and Vth_lo can be defined herein as ΔVth. As examples, ΔVth can be equal to 200 mV, 150-250 mV, 100-300 mV. 200-400 mV, less than 200 mV, greater than 200 mV, greater than 300 mV, less than 300 mV, or other threshold voltage delta.

As comparator 110 oscillates, the comparator crosses a threshold and switches current direction two times per cycle. Even at relatively low oscillation frequencies in the order of 1 MHz, a comparator delay Δtc of 5 nanoseconds (ns) can introduce a one percent error in the capacitance calculation using equation 1. To overcome this problem, capacitance measurement circuitry 100 can be configured in two different measurement modes and two corresponding frequency measurements can be obtained. In a first mode, the threshold voltages of comparator 110 can be set equal to Vth_hi and Vth_lo as shown in FIG. 9. In a second mode, one or both of the comparator threshold voltages can be set to a different value. In the example of FIG. 9, the lower comparator threshold can be raised to an adjusted threshold level Vth_lo'. All other parameters such as Isink and Isource should be kept the same for the two measurement modes. Assuming that the comparator delay Δtc does not depend on the common mode input voltage level, the period durations of the first and second measurement modes will be affected by the same absolute error of 2*Δtc per cycle, which can be numerically eliminated by relating the frequencies and the threshold voltage change between the two measurement modes when computing the final capacitance value.

The operation of the two measurement modes is best understood in connection with the flow chart of FIG. 10. During the operations of block 200, a switched capacitor based radio-frequency circuit (e.g., circuit 60 of the type described in connection with FIGS. 4-9, a switched capacitor based amplifier, a switched capacitor based data converter, etc.) can be operated in a normal mode to carry out its normal functionality in the radio-frequency transmit path. This corresponds to normal mode 150 in FIG. 7 during which switch S1 is activated and switch S2 is deactivated.

During the operations of block 202, the switched capacitor based circuit can be configured to operating in a measurement mode. This corresponds to measurement mode 152 in FIG. 7 during which switch S1 is deactivated and switch S2 is activated. The measurement mode 152 can be used to measure the total (overall) capacitance of the switched capacitors one or more times in a laboratory, one or more times in a factory, and/or periodically or per an on-demand basis in the field. During the operations of block 204, the current levels of Isource and Isink can optionally be measured if they are not already known. If the current levels of Isource and Isink are known, then the operations of block 204 can be omitted. During the operations of block 205, the voltage levels of the threshold voltages Vth_hi and Vth_lo can optionally be determined. If the resistors configured to generate the threshold voltages are well matched, then the threshold voltage levels can be calculated from the ratio of the resistances and the known power supply voltage Vdd. If the resistors are not well matched, then the threshold voltage levels can be measured be selectively feeding Vth_hi and Vth_lo to a separate voltage measurement circuit via one or more additional switches.

Measurement mode 152 can include two measurement modes. Block 206 shows a first measurement mode during which a first frequency can be measured when the comparator threshold voltages are set at nominal threshold levels of Vth_hi and Vth_lo. Block 208 shows a second measurement mode during which a second frequency can be measured when the comparator threshold voltages are set to adjusted threshold levels of Vth_hi and Vth_lo' (see, e.g., FIG. 9). In the example of FIG. 9, raising the lower threshold level from Vth_lo to Vth_lo' will shorten the oscillation period and thus increase the oscillation frequency of the new oscillating waveform 170. In other words, the first frequency value measured during the first measurement mode of block 206 can be considered a lower frequency f_lo, whereas the second frequency value measured during the second measurement mode of block 208 can be considered a higher frequency f_hi. The adjusted threshold level Vth_lo' can be known a priori or can be determined (measured) using a separate voltage measurement unit.

The example of FIG. 9 in which the operations of block 206 is performed before block 208 is merely illustrative. If desired, the operations of block 208 for obtaining f_hi can be performed before obtaining f_lo at block 206. The operations of block 208 described above for raising only the lower comparator threshold from Vth_lo to Vth_lo' is also exemplary. As another example, the second measurement mode can involve adjusting only the higher comparator threshold level (e.g., by only raising or lowering Vth_hi while keeping Vth_lo constant). As another example, the second measurement mode can involve adjusting both comparator threshold levels (e.g., by raising or lowering Vth_lo and also raising or lowering Vth_hi). In general, the voltage generation circuit that outputs these threshold voltages can employ any suitable voltage generating techniques to provide the comparator with two or more reference voltages to help obtain f_hi and f_lo. The various reference voltages output from the voltage generation circuit can be known a priori or can be determined (measured) using a separate voltage measurement circuit. If the reference voltages are known a priori, then the voltage difference between Vth_hi and Vth_lo and the voltage difference between Vth_hi and Vth_lo' are also known. If the reference voltages are later determined (measured), then the voltage differences can be computed once the reference voltages are measured.

During the operations of block 210, a capacitance calculation circuit (e.g., capacitance calculator 114 of FIG. 6) can be configured to compute the total capacitance based on the Isource current level, the Isink current level, frequency measurement f_hi obtained from block 208, frequency measurement f_lo obtained from block 206, and the net amount of threshold voltage adjustment made during block 208. The total capacitance Ctot can be computed using the following equation:

$$Ctot = \frac{2}{\Delta Vth} * \left(\frac{f\_hi - f\_lo}{f\_hi * f\_lo}\right) * \left(\frac{Isource * Isink}{Isource + Isink}\right) \quad (2)$$

Here, ΔVth represents the initial voltage difference between the threshold/reference voltages before making the adjustment at block 208. In equation 2, the factor of two in the numerator may be based on the assumption that ΔVth is reduced by a factor of two when making the f_hi measurement. This can occur, for example, by raising Vth_lo to Vth_lo' during the operations of block 208, where Vth_lo' is the midpoint between Vth_lo and Vth_hi. In general, other adjustments of the comparator threshold level(s) during block 208 will result in other factors in the numerator of equation 2. Computing the total capacitance Ctot in this way can be technically advantageous and beneficial to help account for the comparator delay and thus improve the overall measurement accuracy. If desired, more than two different frequency measurements can be obtained by adjusting either Vth_hi or Vth_lo to other voltage levels. Changing Vth_hi and/or Vth_lo at block 208 will alter the voltage difference between the reference voltages to a different value, thus changing the oscillation frequency of the relaxation oscillator.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is exemplary and various modifications can be made to the described embodiments. The foregoing embodiments may be implemented individually or in any combination.

What is claimed is:

1. Circuitry comprising:
a transformer having a primary coil and a secondary coil;
first switchable capacitors coupled to a first terminal of the primary coil;
second switchable capacitors coupled to a second terminal of the primary coil; and
capacitance measurement circuitry coupled to a center tap of the primary coil and configured to measure a capacitance of the first and second switchable capacitors.

2. The circuitry of claim 1, further comprising:
a first switch having a first terminal coupled to the center tap of the primary coil and having a second terminal configured to receive a bias voltage.

3. The circuitry of claim 2, further comprising:
a second switch having a first terminal coupled to the center tap of the primary coil and having a second terminal coupled to the capacitance measurement circuitry.

4. The circuitry of claim 3, wherein the capacitance measurement circuitry comprises:
a current source selectively coupled to the second terminal of the second switch;
a third switch coupled between the current source and the second terminal of the second switch;
a current sink selectively coupled to the second terminal of the second switch; and
a fourth switch coupled between the current sink and the second terminal of the second switch.

5. The circuitry of claim 4, wherein the capacitance measurement circuitry further comprises:
a fifth switch coupled between the current source and a ground power supply line; and
a sixth switch coupled between the current sink and a positive power supply line.

6. The circuitry of claim 4, wherein the capacitance measurement circuitry further comprises:
a comparator having a first input coupled to the second terminal of the second switch and configured to generate a comparator output signal, wherein the fourth switch is configured to receive the comparator output signal and wherein the third switch is configured to receive an inverted version of the comparator output signal.

7. The circuitry of claim 6, wherein the capacitance measurement circuitry further comprises:
a voltage generation circuit configured to output at least a first threshold voltage and a second threshold voltage to a second input of the comparator.

8. The circuitry of claim 7, wherein the capacitance measurement circuitry further comprises:
a counter configured to receive the comparator output signal and to output a corresponding frequency of the comparator output signal.

9. The circuitry of claim 8, wherein the capacitance measurement circuitry further comprises:
a capacitance calculation circuit configured to compute the capacitance of the first and second switchable capacitors based on a current level of the current source, a current level of the current sink, the frequency of the comparator output signal, and a voltage difference between the first threshold voltage and the second threshold voltage.

10. The circuitry of claim 8, wherein the capacitance measurement circuitry further comprises:
a capacitance calculation circuit configured to compute the capacitance of the first and second switchable capacitors based on a current level of the current source, a current level of the current sink, a first frequency value measured when a voltage difference between the first threshold voltage and the second threshold voltage is at a first value, and a second frequency value measured when the voltage difference is at a second value different than the first value.

11. Wireless circuitry comprising:

a transformer having a primary coil and a secondary coil, the secondary coil having a first terminal coupled to a radio-frequency circuit and having a second terminal coupled to a ground line;

a first plurality of switchable capacitors coupled to a first terminal of the primary coil;

a second plurality of switchable capacitors coupled to a second terminal of the primary coil; and capacitance measurement circuitry coupled to a center tap of the primary coil, wherein the capacitance measurement circuitry includes a current source selectively coupled to the center tap of the primary coil during a charging phase, and a current sink selectively coupled to the center tap of the primary coil during a discharging phase.

12. The wireless circuitry of claim 11, further comprising:

a comparator having a first input selectively coupled to the center tap of the primary coil and having an output on which a comparator output signal is generated;

a voltage generator configured to selectively provide a plurality of reference voltages to a second input of the comparator; and a frequency measurement unit coupled to the output of the comparator and configured to output a frequency of the comparator output signal.

13. An electronic device comprising:

an antenna; and a radio-frequency circuit having an output coupled to the antenna, wherein the radio-frequency circuit includes a transformer having a first coil and a second coil that is coupled to the output, first switchable capacitors coupled to a first terminal of the first coil, second switchable capacitors coupled to a second terminal of the first coil, and measurement circuitry coupled to a center tap of the first coil and configured to measure a capacitance of the first and second switchable capacitors.

14. The electronic device of claim 13, wherein the radio-frequency circuit further comprises:

a first switch having a first terminal coupled to the center tap of the first coil and a second terminal configured to receive a bias voltage; and a second switch having a first terminal coupled to the center tap of the first coil and a second terminal coupled to the measurement circuitry.

15. The electronic device of claim 14, wherein the measurement circuitry comprises:

a current source selectively coupled to the second terminal of the second switch;

a third switch coupled between the current source and the second terminal of the second switch;

a current sink selectively coupled to the second terminal of the second switch; and a fourth switch coupled between the current sink and the second terminal of the second switch.

16. The electronic device of claim 15, wherein the measurement circuitry further comprises:

a fifth switch coupled between the current source and a ground power supply line; and a sixth switch coupled between the current sink and a positive power supply line.

17. The electronic device of claim 15, wherein the measurement circuitry further comprises:

a comparator having a first input coupled to the second terminal of the second switch and configured to generate a comparator output signal, wherein the fourth switch is configured to receive the comparator output signal and wherein the third switch is configured to receive an inverted version of the comparator output signal.

18. The electronic device of claim 17, wherein the measurement circuitry further comprises:

a voltage generation circuit configured to output at least a first threshold voltage and a second threshold voltage to a second input of the comparator; and a counter configured to receive the comparator output signal and to output a corresponding frequency of the comparator output signal.

19. The electronic device of claim 18, wherein the measurement circuitry further comprises:

a calculation circuit configured to compute the capacitance of the first and second switchable capacitors based on a current level of the current source, a current level of the current sink, the frequency of the comparator output signal, and a voltage difference between the first threshold voltage and the second threshold voltage.

20. The electronic device of claim 18, wherein the measurement circuitry further comprises:

a calculation circuit configured to compute the capacitance of the first and second switchable capacitors based on one or more of: a current level of the current source, a current level of the current sink, a first frequency value measured when a voltage difference between the first threshold voltage and the second threshold voltage is at a first value, and a second frequency value measured when the voltage difference is at a second value different than the first value.

* * * * *